United States Patent [19]
Goto

[11] Patent Number: 5,495,185
[45] Date of Patent: Feb. 27, 1996

[54] CMOS LEVEL CONVERSION CIRCUIT WITH INPUT PROTECTION

[75] Inventor: Junkei Goto, Ooita, Japan

[73] Assignee: Kabushiki Kaisha Toshiba, Kawasaki, Japan

[21] Appl. No.: 435,325

[22] Filed: May 5, 1995

Related U.S. Application Data

[63] Continuation of Ser. No. 32,648, Mar. 17, 1993, abandoned.

[30] Foreign Application Priority Data

Mar. 18, 1992 [JP] Japan .................................. 4-062508

[51] Int. Cl.⁶ .................. H03K 19/0948; H03K 19/0185
[52] U.S. Cl. .................................... 326/81; 326/9; 326/83
[58] Field of Search ..................... 307/451, 475, 307/443, 264; 326/9, 31, 68, 81, 80, 83, 113, 121

[56] References Cited

U.S. PATENT DOCUMENTS

| | | |
|---|---|---|
| 4,760,279 | 7/1988 | Saito et al. ............................. 307/451 |
| 4,825,106 | 4/1989 | Tipon et al. ............................ 307/451 |
| 5,036,232 | 7/1991 | Jungert et al. ......................... 307/473 |
| 5,095,229 | 3/1992 | Yun et al. .............................. 307/443 |
| 5,136,186 | 8/1992 | Trinh et al. ............................ 307/443 |

FOREIGN PATENT DOCUMENTS 2-283123  11/1990  Japan .

OTHER PUBLICATIONS

English Abstract of Japanese Publication No. 2–283123.

Primary Examiner—Edward P. Westin
Assistant Examiner—Jon Santamauro
Attorney, Agent, or Firm—Finnegan, Henderson, Farabow, Garrett & Dunner

[57] ABSTRACT

The current paths of the P-channel transistor, P-channel transistor, and N-channel transistor are connected in series between the power source $V_{DD}$ and the ground. The inverter circuit is constituted by the transistors. The node of the inverter circuit is connected to an end of the current path of the N-channel transistor. Another end of the current path of the N-channel transistor is connected to the input node. The transistors are of the enhancement type. If the electric potential higher than the power source $V_{DD}$ is supplied to the input node, the voltage of the node is lower than that of the power source $V_{DD}$ by the threshold voltage ($V_{THN}$) and the transistors are protected from destruction.

16 Claims, 1 Drawing Sheet

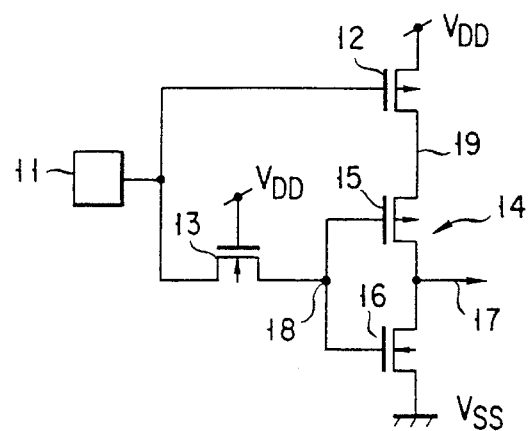
F I G. 1
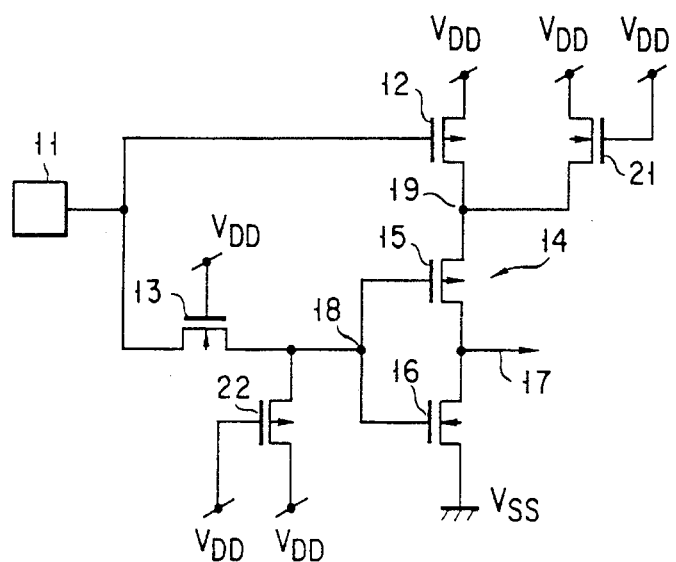
F I G. 2

CMOS LEVEL CONVERSION CIRCUIT WITH INPUT PROTECTION

This application is a continuation of application Ser. No. 08/032,648, filed Mar. 17, 1993, now abandoned.

BACKGROUND OF THE INVENTION

1. Field of the Invention

This invention relates to a level conversion circuit which is adaptable to, for example, a logic circuit.

2. Description of the Related Art

FIG. 3 shows a conventional level conversion circuit. Input node 1 is connected to the drain of N-channel field effect translator 2 in the depletion type. The gate of this transistor 2 is connected to power source $V_{DD}$, and the source thereof is connected to the gate of enhancement type P-channel field effect transistor 4 and that of enhancement type N-channel field effect transistor 5. The source of the transistor 4 is connected to the power source $V_{DD}$, and the drain thereof is connected to output node 6. The drain of the transistor 5 is connected to the output node 6, and the source thereof is connected to the power source $V_{SS}$.

As regards the conventional level conversion circuit as described above, in order to make inverter circuit 3 perform the static operation, threshold voltage $V_{TH}$ of the depletion type N-channel transistor 2 must be set at less than 0 V. Further, this threshold voltage $V_{Th}$ must be set at more than −0.3 V or −0.4 V, in order to prevent the high voltage from being supplied to the gates of the transistors 4 and 5, when the voltage higher than that of the power source $V_{DD}$ is input to the input node 1. Therefore, the design margin of the transistor 2 is small. For this reason, the threshold voltage $V_{TH}$ of the transistor 2 is easily variable with reference to variety of manufacturing processes and changes of the temperature, and stable operations thereof are hardly maintained.

The integrated circuit as shown in FIG. 3 includes the enhancement type transistors and the depletion type transistor. The manufacturing steps of the integrated circuit including the transistors in both types are more than those of an integrated circuit constituted by only enhancement type transistors and then, there will be a problem that the manufacturing cost increases.

SUMMARY OF THE INVENTION

It is an object of this invention to provide a level conversion circuit wherein the level can be surely converted when the voltage higher than that of the power source is input, the circuit can be constituted by only one kind of transistors, and the design margin thereof can be increased, thereby reducing its manufacturing steps and restricting the increase of the cost.

This object is achieved by a level conversion circuit having only field effect transistors of the enhancement type, comprising:

a first transistor of a first conductive type having a gate and a current path, the gate of the first transistor being connected to a signal input terminal and one end of the current path being connected to a first electric potential;

a second transistor of the first conductive type having a gate and a current path, one end of the current path of the second transistor being is connected to another end of the current path of the first transistor and another end of the current path of the second transistor being connected to an output terminal;

a first transistor of a second conductive type having a gate and a current path, one end of the current path of the first transistor in the second conductive type being connected to the output terminal and another end thereof being connected to a second electric potential; and a second transistor of the second conductive type having a gate and a current path, the gate of the second transistor of the second conductive type being connected to the first electric potential, one end of the current path being connected to the signal input terminal, another end thereof being connected to the gate of the second transistor of the first conductive type and the gate of the first transistor of the second conductive type.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 shows a first embodiment of this invention;

FIG. 2 shows a second embodiment of this invention; and

DETAILED DESCRIPTION OF THE PREFERRED EMBODIMENTS

Figure 3:
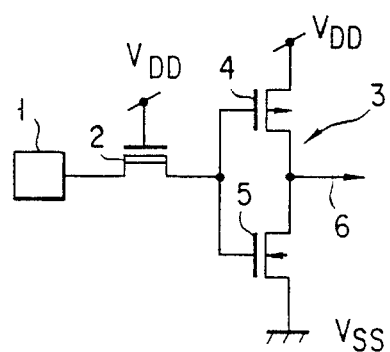
FIG. 3 shows a conventional level conversion circuit.

Embodiments of this invention will be explained with reference to the figures.

FIG. 1 shows the first embodiment of this invention. All of the transistors in this figure are in the enhancement type. Input node 11 is connected to the gate of P-channel transistor 12 and to the drain of the N-channel transistor 13.

The gate of the transistor 13 is connected to power source $V_{DD}$ and the source thereof is connected to the gate of each of P-channel transistor 15 and N-channel transistor 16 which constitute CMOS inverter circuit 14. The drain of the transistor 15 is connected to output node 17, and the source thereof is connected to the drain of the transistor 12. The source of the transistor 12 is connected to power source $V_{DD}$. The drain of the transistor 16 is connected to output node 17, and the source thereof is connected to power source $V_{SS}$ (grounding level).

In this constitution, if, for example, power source $V_{DD}=3.0$ V and the voltage of 5.0 V is input to the input node 11, the electric potential of node 18 (input node of inverter circuit 14) connected to the of the transistor 13 and the gates of the transistors 15 and 16 becomes $(3.0-V_{THN})$V which is obtained by decreasing $V_{DD}=3.0$ V by the threshold voltage ($V_{THN}$) of the transistor 13. For this reason, the transistor 16 is in the ON state and the transistor 15 is in the OFF state. Therefore, the voltage of 0 V is output from the output node 17. At this time, the transistor 12 is in the OFF state, and the electric potential of node 19 connected to the drain of the transistor 12 and the source of the transistor 15 becomes at about $V_{DD}$ level which is higher than the electric potential of the node 18 by the threshold voltage ($V_{THP}$) of the transistor 15, i.e. the electric potential of the node 19 is set so as not to be more than power voltage $V_{DD}$ by the transistor 12 being in the OFF state.

On the other hand, if 0 V is supplied to input node 11, the electric potential of the node 18 becomes 0 V, the transistor 16 is in the OFF state, and the transistors 12 and 15 are in the ON state. Therefore, the power voltage $V_{DD}$ is output from the output node 17.

According to this embodiment, if, for example, a signal having an amplitude of voltage in the range from 0 V to 5.0 V higher than $V_{DD}$ is input to the input node 11, a signal of 0–3.0 V ($V_{SS}$–$V_{DD}$) can be output from the output node 17. Since voltages between the gate and source, between the gate and drain, and between the drain and source of each transistor are not more than $V_{DD}$, reliability of all the transistors can be assured.

In the circuit shown in FIG. 1, the sum ($2V_{THN}$) of the threshold voltages of the transistors 13 and 16 is set to be less than $V_{DD}$. Therefore, the design margin of the circuit can be increased and can easily be designed.

Further, since all the transistors in this circuit belong to the enhancement type, the circuit can easily be manufactured and the increase of its cost can be restricted.

FIG. 2 shows a second embodiment of this invention. In this figure, the same elements as those shown in FIG. 1 are indicated by the same reference numerals, and only different elements are explained.

The source of N-channel transistor 21 is connected to the drain of the transistor 12. The drain and the gate of the transistor 21 are connected to power source $V_{DD}$. The drain of P-channel transistor 22 is connected to the source of the transistor 13. The source and the gate of the transistor 22 are connected to the power source $V_{DD}$.

In this constitution, the transistor 21 protects the transistor 12, and the transistor 22 protects the transistor 16. The electric potential of the node 19 has a possibility of leaking through the transistor 15 and the output node 17 and lowering to the ground level. This influence is great when the transistors 12 and 15 are in the OFF state. In this way, when high electric potential is supplied to input node 11 in the state that the electric potential of the node 19 is lowered to the ground level, the voltage between the gate and the drain, of the transistor 21 may be more than an allowable value. Then, the electric potential of the node 19, i.e. that of the drain of the transistor 12 is prevented by the transistor 21 from being lowered under the threshold voltage ($V_{THN}$) of the transistor 21. Therefore, the transistor 12 can be protected.

The electric potential of the node 18 is sometimes raised by the electric charge supplied from the input node 11 through the transistor 13. In this case, the voltage between the gate and the source of the transistor 16 sometimes rises over the allowable value. For this reason, the electric potential of the node 18, i.e. the electric potential between the gate and the source of the transistor 16 is prevented by the transistor 22 from being raised over the threshold voltage ($V_{THP}$) of the transistor 22. Therefore, the transistor 16 can be protected.

According to this embodiment, the reliability of the circuit can be much increased.

This invention is not limited to the above embodiments, and of course, can be variably accomplished in the range which does not change the contents of this invention.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A level conversion circuit having only field effect transistors of the enhancement type, comprising:

a first transistor of a first conductive type having a gate and a current path, the gate of the first transistor of the first conductive type being connected to a signal input terminal and one end of the current path being connected to a first electric potential;

a second transistor of the first conductive type having a gate and a current path, one end of the current path of the second transistor of the first conductive type being connected to another end of the current path of the first transistor and another end of the current path of the second transistor of the first conductive type being connected to an output terminal;

a first transistor of a second conductive type having a gate and a current path, one end of the current path of the first transistor of the second conductive type being connected to the output terminal and another end thereof being connected to a second electric potential; and a second transistor of the second conductive type having a gate and a current path, the gate of the second transistor of the second conductive type being connected to the first electric potential, one end of the current path being connected to the signal input terminal, another end thereof being directly connected to the gate of the second transistor of the first conductive type and the gate of the first transistor of the second conductive type, wherein a potential of said another end of said second transistor of said second conductive type differs from a potential of said one end of said second transistor of said second conductive type.

2. The circuit according to claim 1, wherein the voltage between the gate and source, between the gate and drain, and between the drain and the source in each of the first transistor of the first conductive type, the second transistor of the first conductive type, the first transistor of the second conductive type, and the second transistor of the second conductive type is predetermined to be under the first electric potential.

3. The circuit according to claim 1, wherein the sum of the threshold voltage of the second transistor of the second conductive type and that of the first transistor of the second conductive type is predetermined to be under the first electric potential.

4. The circuit according to claim 1, wherein the first and second transistors of the first conductive type are P-channel transistors, and the first and second transistors of the second conductive are N-channel transistors.

5. A circuit according to claim 1, wherein said potential of said another end of said second transistor of the second conductive type is lower than a potential of the one end of said second transistor of the second conductive type.

6. A level conversion circuit having only field effect transistors of the enhancement type, comprising:

a first transistor of a first conductive type having a gate and a current path, the gate of the first transistor of the first conductive type being connected to a signal input terminal and one end of the current path being connected to a first electric potential;

a second transistor of the first conductive type having a gate and a current path, one end of the current path of the second transistor of the first conductive type being connected to another end of the current path of the first transistor and another end of the current path of the second transistor of the first conductive type being connected to an output terminal;

a first transistor of a second conductive type having a gate and a current path, one end of the current path of the first transistor of the second conductive type being connected to the output terminal and another end thereof being connected to a second electric potential;

a second transistor of the second conductive type having a gate and a current path, the gate of the second transistor in the second conductive type being connected to the first electric potential, one end of the current path being connected to the signal input terminal, another end thereof being connected to the gate of the second transistor of the first conductive type and the gate of the first transistor of the second conductive type;

a third transistor of the second conductive type having a gate and a current path, the gate and one end of the current path of the third transistor of the second conductive type being connected to the first electric potential and another end of the current path of the third transistor of the second conductive type being connected to said another end of the current path of the first transistor of the first conductive type; and a third transistor of the first conductive type having a gate and a current path, wherein the gate and one end of the current path of the third transistor of the first conductive type are connected to the first electric potential, and another end of the current path is connected to said another end of the current path of the second transistor of the second conductive type.

7. The circuit according to claim 6, wherein the voltage between the gate and source, between the gate and drain, and between the drain and the source in each of the first transistor of the first conductive type, the second transistor of the first conductive type, the first transistor of the second conductive type, and the second transistor of the second conductive type is predetermined to be under the first electric potential.

8. The circuit according to claim 6, wherein the sum of the threshold voltage of the second transistor of the second conductive type and that of the first transistor of the second conductive type is predetermined to be under the first electric potential.

9. A level conversion circuit comprising:

a first P-channel transistor having a gate and a current path, the gate of the first P-channel transistor being connected to a signal input terminal and one end of the current path being connected to a first electric potential;

a second P-channel transistor having a gate and a current path, one end of the current path of the second P-channel transistor being connected to another end of the current path of the first P-channel transistor and another end of the current path of the second P-channel transistor connected to an output terminal;

a first N-channel transistor having a gate and a current path, one end of the current path of the first N-channel transistor being connected to the output terminal and another end thereof being connected to a second electric potential; and a second N-channel transistor having a gate and a current path, the gate of the second N-channel transistor being connected to the first electric potential, one end of the current path being connected to the signal input terminal, another end thereof being directly connected to the gate of the second P-channel transistor and the gate of the first N-channel transistor, wherein a potential of said another end of said second N-channel transistor is lower than a potential of said one end of said second N-channel transistor.

10. The circuit according to claim 9, wherein the voltage between the gate and source, between the gate and drain, and between the drain and the source in each of the first P-channel transistor, the second P-channel transistor, the first N-channel transistor, and the second N-channel transistor is predetermined to be under the first electric potential.

11. The circuit according to claim 9, wherein the sum of the threshold voltage of the second N-channel transistor and that of the first N-channel transistor is predetermined to be under the first electric potential.

12. The circuit according to claim 9, wherein the first P-channel transistor, the second P-channel transistor, the first N-channel transistor, and the second N-channel transistor are of the enhancement type.

13. A level conversion circuit comprising:

a first transistor of a first conductive type having a gate and a current path, the gate of the first transistor of the first conductive type being connected to a signal input terminal and one end of the current path being connected to a first electric potential;

a second transistor of the first conductive type having a gate and a current path, one end of the current path of the second transistor of the first conductive type being connected to another end of the current path of the first transistor and another end of the current path of the second transistor of the first conductive type being connected to an output terminal;

a first transistor of a second conductive type having a gate and a current path, one end of the current path of the first transistor of the second conductive type being connected to the output terminal and another end thereof being connected to a second electric potential;

a second transistor of the second conductive type having a gate and a current path, the gate of the second transistor of the second conductive type being connected to the first electric potential, one end of the current path being connected to the signal input terminal, another end thereof being connected to the gate of the second transistor of the first conductive type and the gate of the first transistor of the second conductive type;

a third transistor of the second conductive type having a gate and a current path, wherein the gate and one end of the current path of the third transistor of the second conductive type are connected to the first electric potential, and another end thereof is connected to said another end of the current path of the first transistor of the first conductive type; and a third transistor of the first conductive type having a gate and a current path, wherein the gate and one end of the current path of the third transistor of the first conductive type are connected to the first electric potential and another end thereof is connected to said another end of the current path of the second transistor of the second conductive type.

14. The circuit according to claim 13, wherein the voltage between the gate and source, between the gate and drain, and between the drain and the source in each of the first transistor of the first conductive type, the second transistor of the first conductive type, the first transistor of the second conductive type, and the second transistor of the second conductive type is predetermined to be under the first electric potential.

15. The circuit according to claim 13, wherein the sum of the threshold voltage of the second transistor in of the second conductive type and that of the first transistor of the second conductive type is predetermined to be under the first electric potential.

16. The circuit according to claim 13, wherein the first transistor of the first conductive type, the second transistor of the first conductive type, the third transistor of the first conductive type, the first transistor of the second conductive type, the second transistor of the second conductive type, and the third transistor of the second conductive type are of the enhancement type.

* * * * *

UNITED STATES PATENT AND TRADEMARK OFFICE
CERTIFICATE OF CORRECTION

PATENT NO. : 5,495,185
DATED : February 27, 1996
INVENTOR(S) : Junkei GOTO

It is certified that error appears in the above-indentified patent and that said Letters Patent is hereby corrected as shown below:

Claim 15, Column 7, line 10, after "transistor", delete "in".

Signed and Sealed this

Nineteenth Day of November, 1996

BRUCE LEHMAN

Attest:

Attesting Officer          Commissioner of Patents and Trademarks